United States Patent
Hsu et al.

(10) Patent No.: US 6,628,557 B2
(45) Date of Patent: Sep. 30, 2003

(54) LEAKAGE-TOLERANT MEMORY ARRANGEMENTS

(75) Inventors: Steven K. Hsu, Lake Oswego, OR (US); Ram Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 119 days.

(21) Appl. No.: 09/966,193

(22) Filed: Sep. 28, 2001

(65) Prior Publication Data

US 2003/0063511 A1 Apr. 3, 2003

(51) Int. Cl.[7] ................................................. G11C 7/00
(52) U.S. Cl. ........................ 365/204; 365/203; 365/194
(58) Field of Search ................................. 365/203, 194, 365/154, 189.02, 189.09, 204

(56) References Cited

U.S. PATENT DOCUMENTS

| | | | |
|---|---|---|---|
| 5,434,822 A | * | 7/1995 | Deleganes et al. .......... 365/203 |
| 5,471,421 A | | 11/1995 | Rose et al. |
| 5,583,821 A | | 12/1996 | Rose et al. |
| 6,137,319 A | | 10/2000 | Krishnamurthy et al. |
| 6,181,608 B1 | | 1/2001 | Keshavarzi et al. |
| 6,204,696 B1 | | 3/2001 | Krishnamurthy et al. |
| 6,225,826 B1 | | 5/2001 | Krishnamurthy et al. |
| 6,429,711 B1 | * | 8/2002 | Tschanz et al. ............. 327/211 |

OTHER PUBLICATIONS

Rajesh Kumar, Desktop Platforms Group–Circuit Technology, Intel Corp.; Interconnect and Noise Immunity Design for the Pentium 4 Processor, Intel Technology Journal Q1, 2001; pp. 12.

* cited by examiner

*Primary Examiner*—Vu A. Le
(74) *Attorney, Agent, or Firm*—John F. Travis

(57) ABSTRACT

The present invention is in the area of memory architecture. More particularly, the present invention provides a method, apparatus, machine-readable medium, and system reduce leakage current in memory. Embodiments may take advantage of the reverse bias characteristic of circuit elements, such as the reverse gate-to-source bias characteristic of a transistor, within the memory to limit leakage and provide for a leakage tolerant data storage technique. Embodiments may also enable the reverse bias characteristic of circuit elements, such as the reverse gate-to-source bias characteristic of a transistor, to be taken advantage of by sourcing charge from data storage elements.

17 Claims, 14 Drawing Sheets

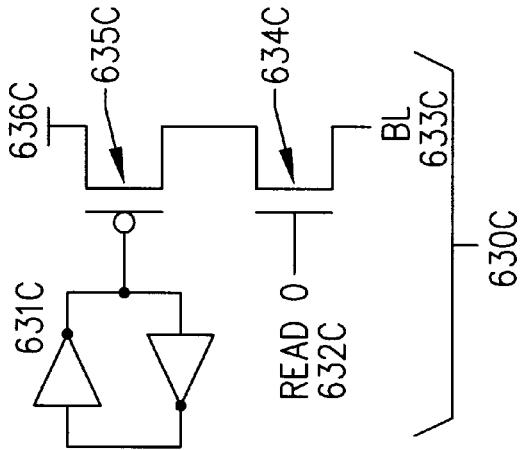
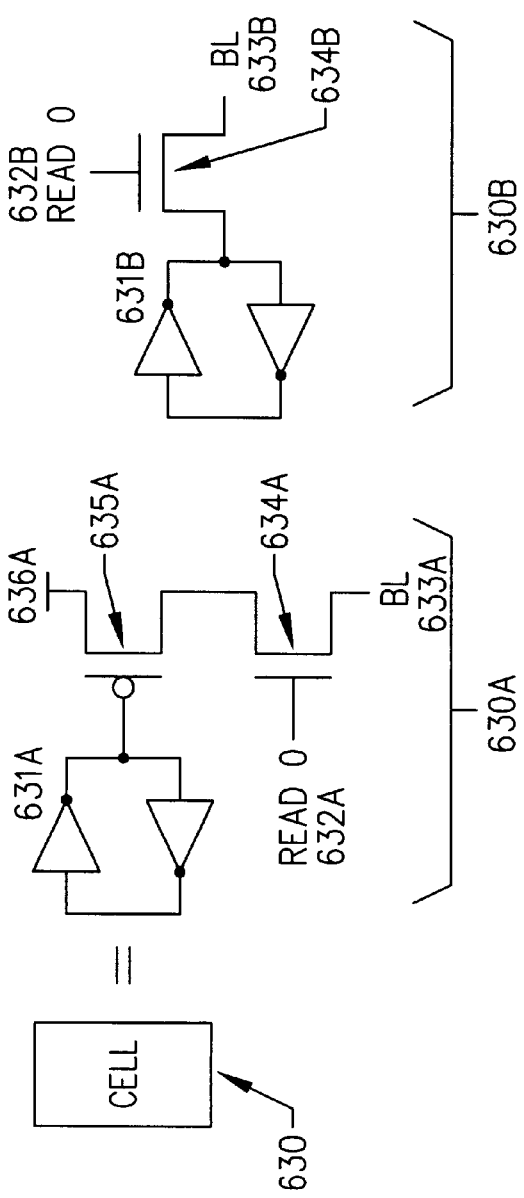
FIGURE 6C
FIGURE 6B
FIGURE 6A

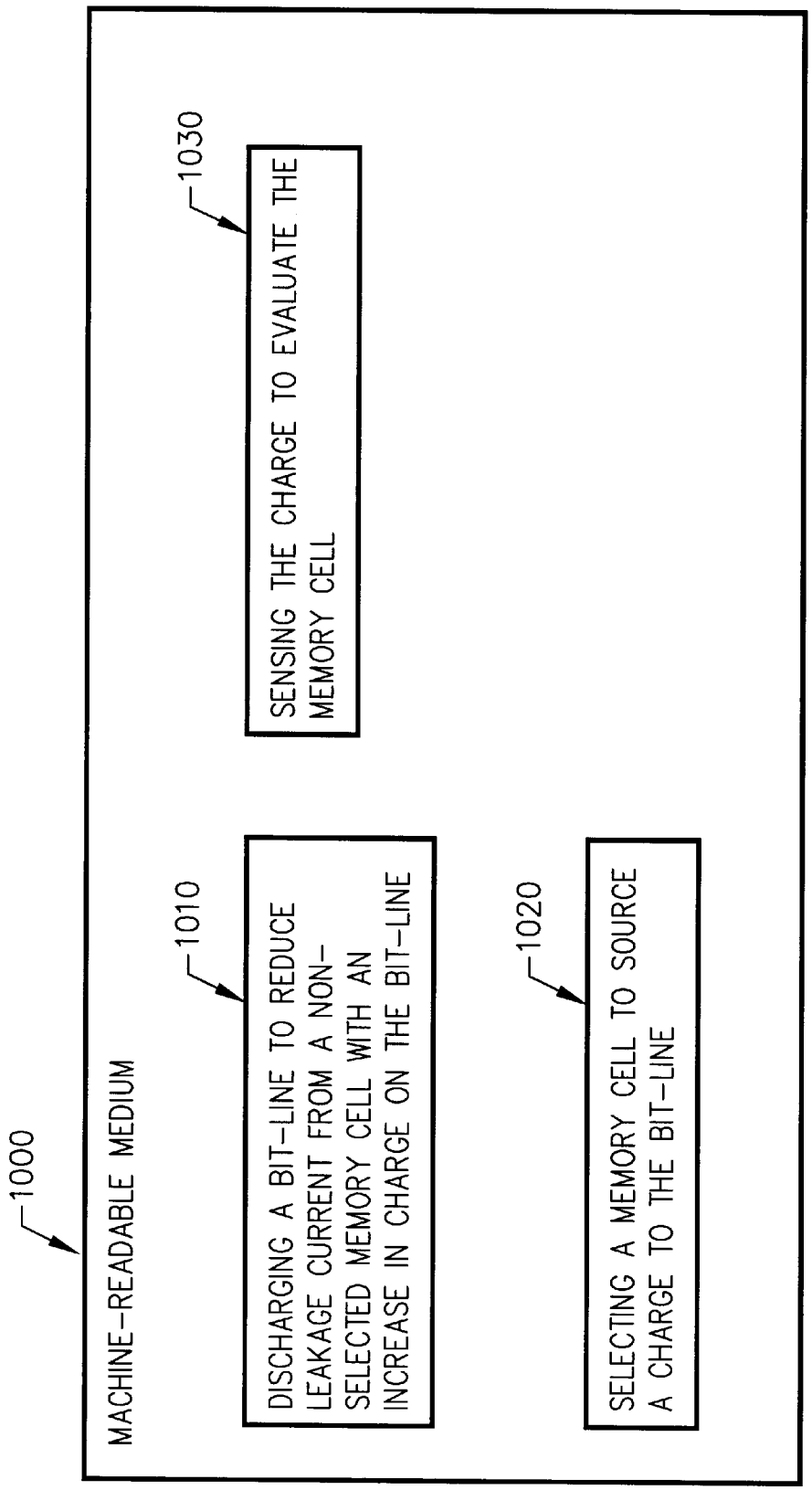

LEAKAGE-TOLERANT MEMORY ARRANGEMENTS

FIELD OF INVENTION

The present invention is in the area of memory architecture. More particularly, the present invention provides a method, apparatus, machine-readable medium, and system for a leakage tolerant memory design.

BACKGROUND

Memory devices designed for scalability, speed, robustness, and compactness, such as a cache, may be evaluated by selecting a memory cell to be read, leaving the remainder of the memory cells coupled to the same bit-line deselected. Selecting a memory cell can comprise turning on an access transistor for the selected memory cell to allow the memory element of the cell to pull charge from the bit-line to a circuit ground. Deselecting a memory cell involves turning off the access transistors to prevent the non-selected memory cells from pulling charge from the bit-line. Even after the access transistors for the non-selected memory cells are turned off, the transistors still leak some charge and the sum of the entire off device leakage can be equivalent or greater than a single on device current, thus causing a false evaluation.

Although the leakage current of a memory cell is small, the leakage becomes a larger issue as memory arrays grow in size. A memory array increases leakage currents proportionately with growth since growth involves increasing the number of memory cells coupled to the same bit-line in parallel. When leakage currents approach or exceed the charge pulled by the selected memory cell, the sense circuitry of the memory device may require more time to distinguish or may be unable to distinguish a voltage drop due to pulling by a selected memory cell from a voltage drop due to leakage current.

Circuitry can be added to reduce leakage current or at least the effects of leakage, but adding circuitry involves trade-offs in the design of the memory devices. For example, dual-$V_t$ process allows high threshold (high-$V_t$) transistors as access devices that will decrease the bit-line leakage current, but high threshold access devices are not as fast as low-$V_t$ devices. Whereas, maximizing the access speed by using low voltage threshold (low $V_t$) access transistors, causes an increase in the bit-line leakage. Similarly, in full-swing single-ended memories, a keeper circuit is incorporated to replenish the leakage current. The strength of the keeper circuitry can be increased to handle increases in leakage current as memory arrays become wider, but increasing the keeper size adds cost and size to memory arrays, as well as evaluation time.

BRIEF DESCRIPTION OF THE DRAWINGS

In the accompanying drawings, like references may indicate some similarities between elements:

FIGS. 6A–C depict example memory cells for a single-ended memory array.

FIG. 10 depicts an embodiment of a machine-readable medium with instructions for leakage tolerant memory.

DETAILED DESCRIPTION OF EMBODIMENTS

The following is a detailed description of example embodiments of the invention depicted in the accompanying drawings. The example embodiments are in such detail to clearly communicate the invention. However, the amount of detailed offered is not intended to limit the anticipated variations of embodiments. The variations of embodiments anticipated for the present invention are too numerous to discuss individually so the detailed descriptions below are designed to make such embodiments obvious to a person of ordinary skill in the art.

Figure 1:
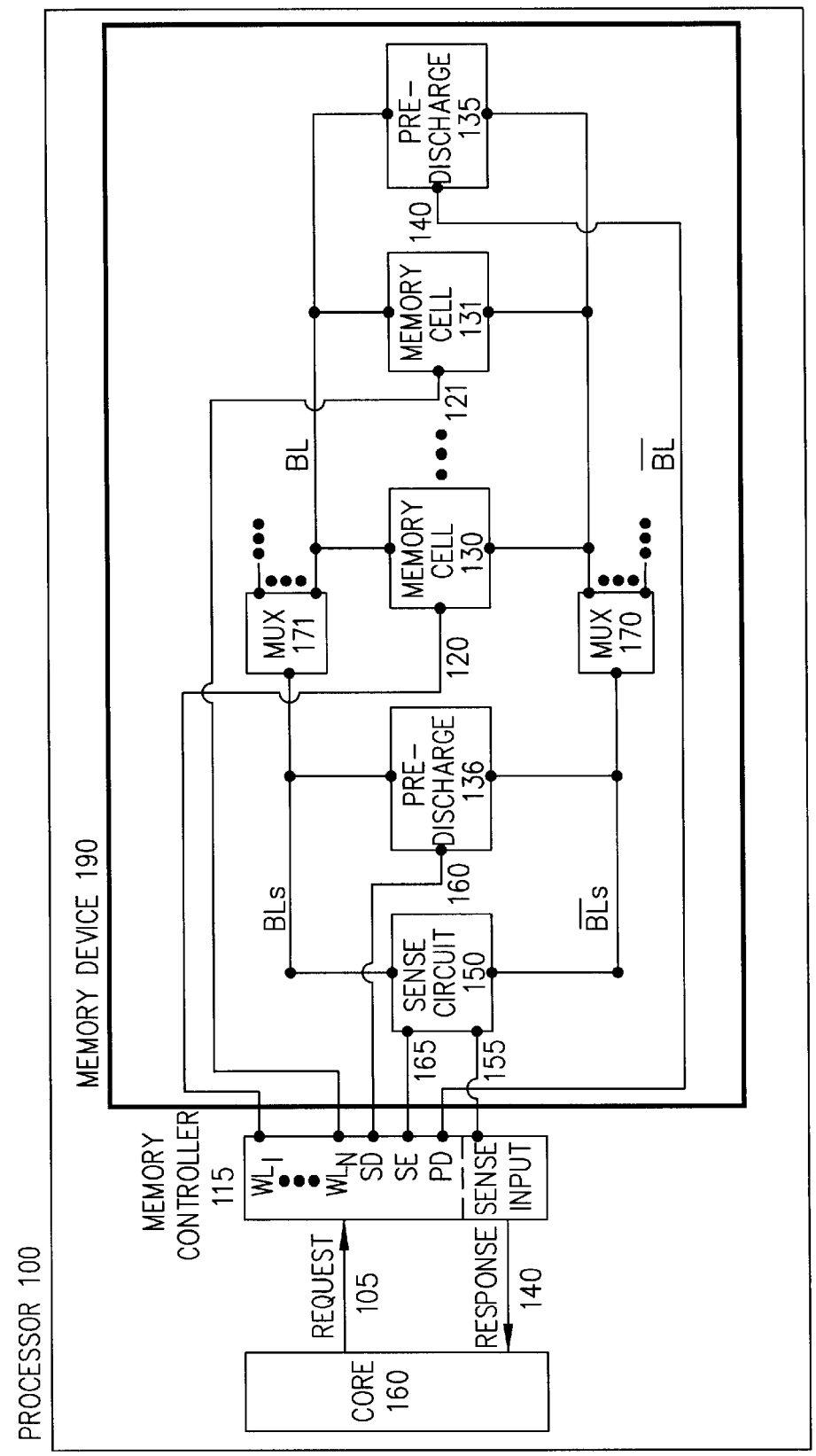
FIG. 1 depicts a processor having with a single-ended memory array.

Referring now to FIG. 1, one embodiment may comprise a processor 100 with core 180 coupled to a memory controller 115 and a memory device 190 coupled to the memory controller 115 to provide storage and read access to the core 180. For example, the processor 100 may be a microprocessor for a general or specific purpose computer and the microprocessor may comprise cache such as memory device 190 to provide low access latency for code of a command executed frequently. The memory controller 115 may be a cache controller designed to determine the data that is accessed most frequently by the core 180 and store that data in memory device 190.

The memory controller 115 may comprise a word-line (WL) signal $WL_1$ through a $WL_N$ for each bit-line (BL) of the memory device 190 to facilitate selection of one memory cell. The memory controller 115 may select a memory cell by applying a first voltage to the word-line of the selected memory cell, while a second voltage to the word-lines remains coupled to non-selected memory cells. Memory controller 115 may comprise a sense discharge signal (SD) 160 to discharge the bit-lines of a sensing circuit prior to coupling the bit-lines of the sense circuit to a selected row of memory cells comprising the selected memory cell. The pre-discharge signal (PD) of the memory controller 115 may discharge the bit-lines coupled to the selected row of memory cells. After the bit-lines of the selected row and sensing circuit are discharged and the selected row of memory cells are latched, the memory controller may read the selected memory cell by applying a voltage to the sense enable (SE) signal. Finally, the sense input may receive the contents of the selected memory cell via the sense amplifier data output.

The memory device 190 may comprise a pre-discharge circuit 135; a pre-discharge circuit 136; a pair of multiplexers, MUX 170 and MUX 171; a first memory cell, memory cell$_1$ 130, through an Nth memory cell, memory cell$_N$ 131; and a sense circuit 150. The pre-discharge circuit 135 may discharge the bit-lines BL and BL bar coupled memory cell$_1$ 130 through memory cell$_N$ 131 to a circuit ground, Vss, and pre-discharge circuit 136 may discharge the bit-lines, BLs and BLs bar, coupled to the sense circuit 150 to Vss. Pre-discharging the bit-lines BL, BL bar, BLs and BLs bar to circuit ground may facilitate low voltage switching by MUX 170 and MUX 171 when the multiplexers couple the selected row of memory cells to the sense circuit 150.

Memory cell$_1$ 130, through memory cell$_N$ 131 may comprise charge storage for the memory device 190. The memory cells in this embodiment comprise differential cells but, in many embodiments, the memory cells may be single-ended. Each memory cell may comprise a differential memory element and selection circuitry, such as two access transistors, one coupling a first output of the memory element to BL and a second coupling the differential output of the memory element to BL bar. After the access transistors are enabled, leakage current may occur between the non-selected memory cells and the bit-lines. In one situation, for example, the selected memory cell may comprise a memory element having a high charge coupled to BL and a low charge coupled to BL bar. Further, the non-selected memory cells may comprise memory element having a low charge coupled to BL and a high charge coupled to BL bar via access transistors. The access transistors of the memory cells may be turned off, but a leakage current may flow between each non-selected memory cell and BL bar. The resulting charge build up on BL bar may increase along side the increase on BL sourced by the selected memory cell. However, after the charge on BL bar reaches the reverse-bias voltage, such as the reverse gate-to-source bias voltage, of the non-selected access transistors, the leakage current from that non-selected memory cell significantly reduces in accordance with the reverse bias characteristic of the non-selected memory cell's access transistor.

In alternative embodiments, the pre-discharge circuitry may discharge the bit-lines BL, BL bar, BLs, and BLs bar to or above a voltage equivalent to or greater than the reverse bias voltage of one or more of the access transistors of memory cell$_1$ 130 through memory cell$_N$ 131. When BL and BL bar are discharged to the reverse-bias voltage of the selection circuitry, such as the reverse gate-to-source bias voltage when the source of an access transistor is coupled to the bit-line, the leakage current from the memory cells may not be a significant factor for noise on the bit-lines.

The sense circuit 150 may evaluate the selected memory cell based on a comparison between the charges on BL and BL bar via BLs and BLs bar. While the sense circuit 150 senses the charge passed to BL by the selected memory cell, the sense circuit 150 may also sense the leakage current, or the sum of leakage currents, from the non-selected memory cells. In many embodiments, the sense circuit 150 may be enabled after the charge on a bit-line reaches the reverse-bias voltage of the selection circuitry for the non-selected memory cells.

For example, core 180 may produce a request 105 for data including the address of the data. Memory controller 115 may receive a request 105 and the request 105 may contain an address corresponding to memory cell$_1$ 130. The memory controller 115 may convert the request 105 and address to word-line signals at WL$_1$ through WL$_N$ to select memory cell$_1$ while the remainder of the memory cells through memory cell$_N$ remain unselected. Before outputting the word-line signals, the memory controller 115 may strobe a sense discharge signal on SD to pre-discharge circuitry 136 and a pre-discharge signal on PD to pre-discharge circuitry 135. In response, pre-discharge circuitry 135 and pre-discharge circuitry 136 may pull BLs and BLs bar down to a low voltage. The memory controller 115 may then output a high voltage at WL$_1$ and a low voltage at the rest of the word-line signals through WL$_N$.

Memory controller 115 may output a sense enable signal at SE 165 to sense circuit 150. Sense circuit 150 may then compare BLs with BLs bar. Depending on the voltage difference, sense circuit 150 may output a sense amplifier data out signal 155. Memory controller 115 may receive the sense amplifier data out signal 155 at the sense input and convert the sense signal into a response for core 180.

Figure 2:
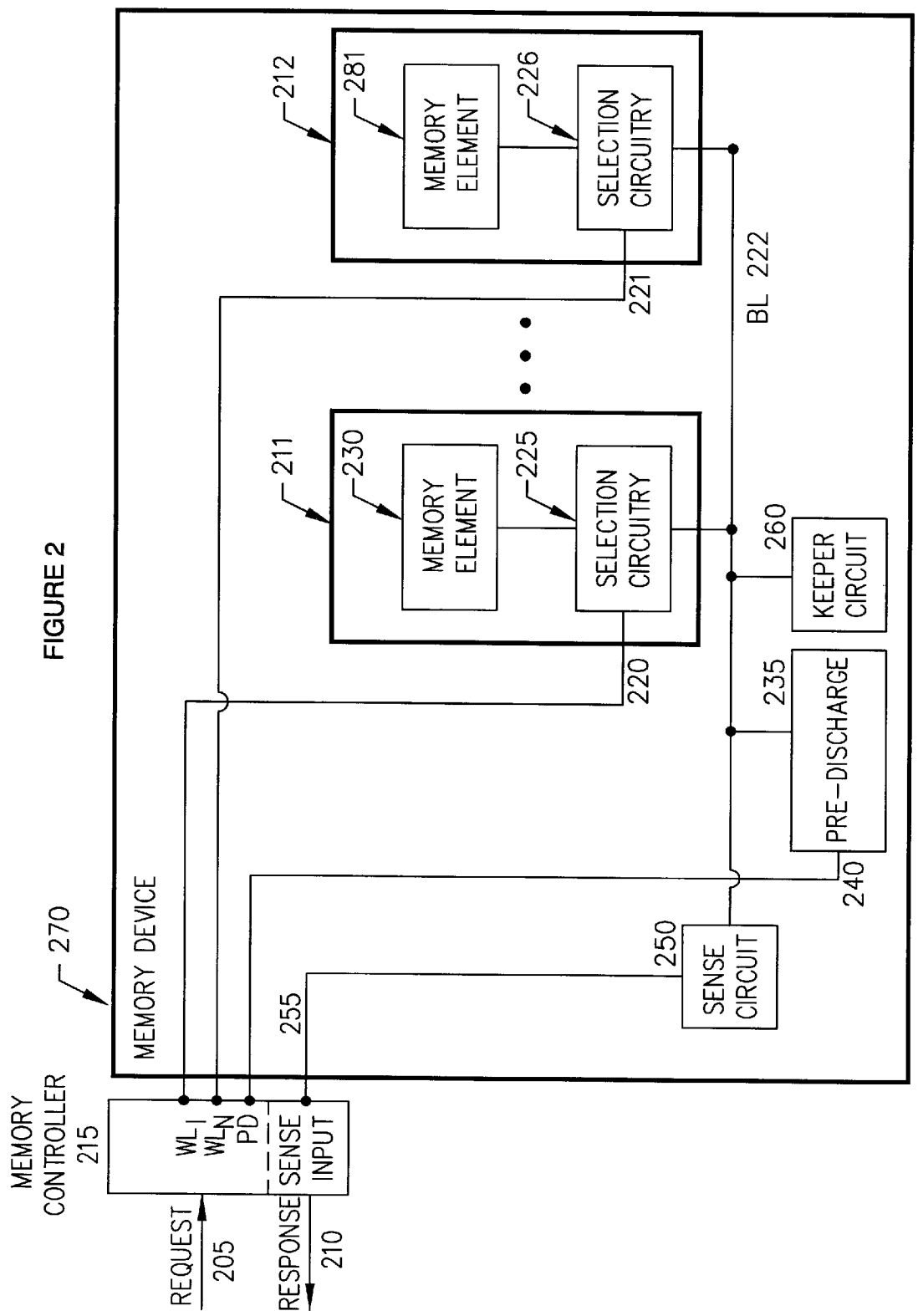
FIG. 2 depicts memory system with a single-ended memory cell array.

Referring now to FIG. 2, there is shown one embodiment comprising a memory to access frequently used data and/or code for a processor or processor core. The memory may comprise a memory controller 215 and a memory device 270. The memory controller 215 may comprise a request node 205 to receive a request for data, a response node 210 to send a response, a pre-discharge node (PD) to pre-discharge bit-line (BL), word-line outputs WL$_1$ through WL$_N$ to release a charge stored in a memory cell to BL, and the sense amplifier data out signal 155 to receive the value released to BL from the memory cell as sensed by memory device 270.

The memory controller 215 may receive a request to evaluate a memory cell at request 205. In one embodiment, this signal may contain address information of the memory cell. In response, the memory controller 215 may transmit a pre-discharge signal from PD to pre-discharge BL of memory device 270, the bit-line coupled to the memory cell. The memory controller 215 may apply word-line signals from WL$_1$ through WL$_N$ to the memory device 270 to select the memory cell and, upon selecting the memory cell, memory controller 215 may receive a voltage representing data of the memory cell at the sense input and use the voltage to create a response 210. In one embodiment, the response may comprise returning the requested address along with the logical state of the data stored in the selected memory cell.

Memory device 270 may comprise pre-discharge circuit 235, BL, keeper circuit 260, memory cell$_1$ 211 through memory cell$_N$ 212, and sense circuit 250. Memory cell$_1$ 211 through memory cell$_N$ 212 may be coupled to the BL to pass the charge of one or more of the memory elements to BL and BL may be coupled to the sense circuit 250 to output charge from the one or more memory elements. For example, pre-discharge circuit 235 may receive a high voltage from PD of memory controller 215. In response to the high voltage, pre-discharge circuit 235 may pull charge from BL. In one embodiment, the pre-discharge circuitry 235 may pull sufficient charge from BL to reduce the voltage of BL to a voltage near a circuit ground voltage. After pre-discharging BL, keeper circuitry 260 may pull charge from BL to remove leakage current of non-selected memory cells until the BL reaches a switching threshold voltage such as (V$_{DD}$–Vss)/2. The switching threshold voltage may turn off the keeper circuit 260 when a charge of a high logic state is sourced to BL by a selected memory cell. When the charge stored by the selected memory cell is a low voltage state, such as a state represented by Vss, leakage current from non-selected memory cells may cause BL to build up a charge. The charge build up on BL may be greater than the keeper circuit 260 may remove in some embodiments. However, as the charge increases and approaches the reverse gate-to-source bias voltage of read transistors of the non-selected memory cells the leakage current of the non-selected memory cells may be significantly less.

The sense circuitry 250 may convert the voltage on BL for the memory controller 215. In one embodiment the conversion may comprise inverting the voltage on BL. For example, the BL may be a high voltage in response to memory element$_1$ 230 passing charge to the BL. The high voltage on BL may be greater than a high voltage threshold of the sense circuitry 250 so the sense circuitry 250, recognizing that the selected memory cell sourced a high voltage, may output a low voltage. Similarly, the sense circuitry 250 may output a high voltage in response to a low voltage on BL. Further, sense circuitry 250 may comprise static circuitry that converts the BL voltage without other dynamic inputs.

Figure 3:
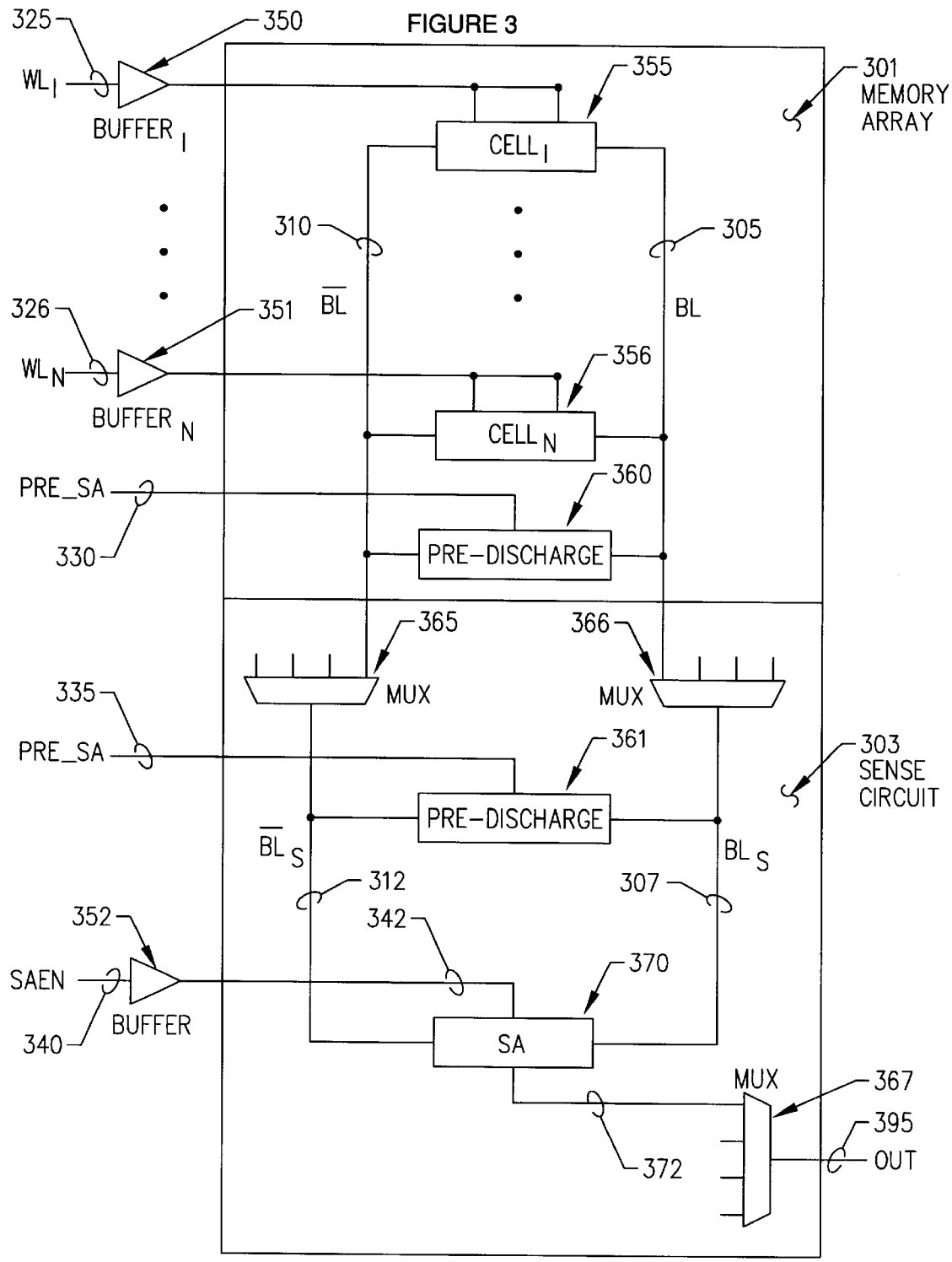
FIG. 3 depicts a differential memory device.

Referring now to FIG. 3, a differential memory device robust to leakage of memory cells is shown. The differential memory device may comprise a memory array 301 and a sense circuit 303. The memory array 301 may facilitate storage and access to data. The memory array 301 may comprise word-line signals WL$_1$ through WL$_N$ via buffer$_1$ 350 through buffer$_N$ 350; memory cells, cell$_1$ 355 through cell$_N$ 356, differential bit-line pair, BL and BL bar; bit-line pre-discharge input (PRE_BL), and pre-discharge circuitry 360. Substantially simultaneously with discharging sense circuit 303, memory array 301 may be discharged by pre-discharge circuit 360, coupled to the sense circuit 303, and receive memory cell selection signals via WL$_1$ through WL$_N$ to select a memory cell and the remainder of the memory cells may stay deselected.

Figure 3A:
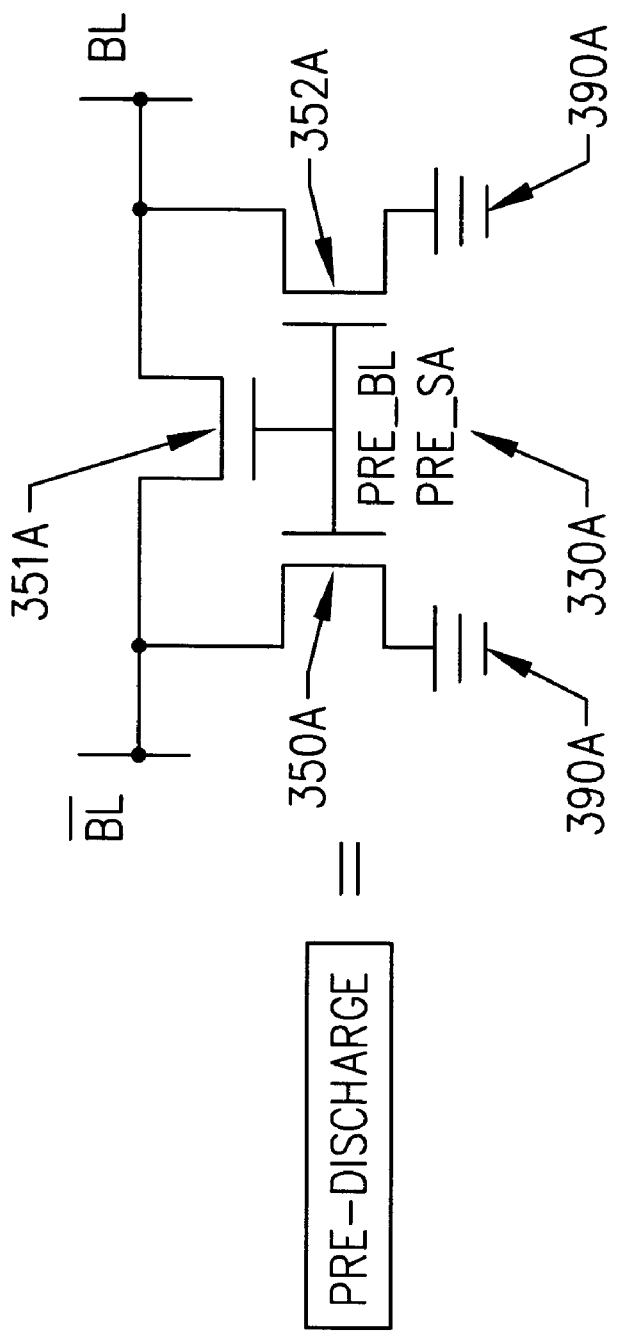
FIGS. 3A–C depict embodiments of circuitry for a pre-discharge circuit, memory cell, and sense amplifier for a differential memory device.

Referring now to FIGS. 3 and 3A, pre-discharge circuitry 360 may discharge BL and BL bar in response to a signal on PRE_BL. FIG. 3A shows example circuitry to discharge bit-lines BL and BL bar. In the present embodiment, the same circuitry is used to discharge the sense circuit 303. The pre-discharge circuitry 360 may receive the signal, PRE_BL, comprising a high voltage pulse such as a clock signal or strobe signal with a high circuit voltage, V$_{DD}$, and the strobe may turn on the transistors 350A, 351A, and 352A. Transistors 350A and 352A may sink charges from both BL and BL bar to circuit ground 390A and transistor 351A may equalize any residual charge between BL and BL bar so that BL and BL bar are initially at the same potential. When PRE_BL transitions low, BL and BL bar may be disconnected from ground.

In many embodiments, transistors 350A and 352A may sink bit-lines BL and BL bar to a voltage near the reverse gate-to-source bias voltage for the access transistors of the memory cells coupled to BL and BL bar. In some embodiments, Vss may be near the reverse gate-to-source bias voltage of the access transistors and in other embodiments, where a voltage closer to the reverse gate-to-source bias voltage of the access transistors is available, BL and BL bar may be discharged to the closer voltage. Several of these embodiments sink the charges on BL and BL bar to a voltage at or above the reverse gate-to-source-bias voltage of the access transistors such that the access transistors of many of the non-selected memory cells may have a reverse gate-to-source voltage biased prior to sourcing charge to one of the bit-lines from the selected memory cell.

Figure 3B:
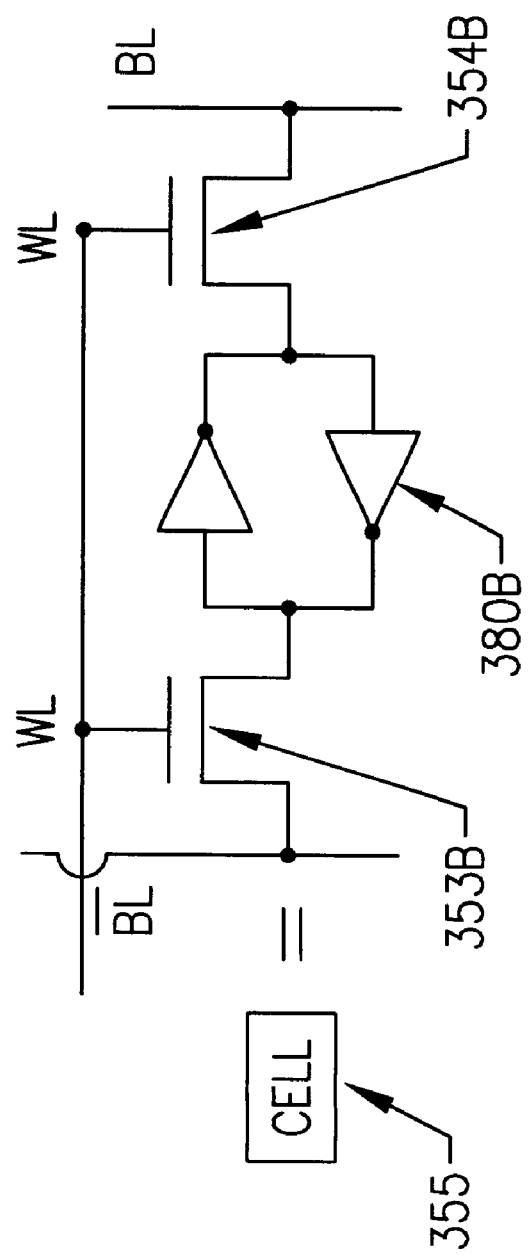

Referring now to FIGS. 3 and 3B, memory cells, cells 355 through cell$_N$ 356, receive selection signals, in the present embodiment, after bit-lines BL and BL bar are coupled to BLs and BLs bar of the sense circuit 303. FIG. 3B shows example circuitry for each memory cell. Each memory cell comprises two access transistors, 353B and 354B, and a differential memory element 380B. The differential memory element may be designed to maintain a low voltage at a node coupled to one access transistor and maintain a high voltage at a node coupled to a second access transistor. For example, transistor 353B may see a voltage equivalent to a logical one, e.g. V$_{DD}$, and transistor 354B may see a voltage equivalent to a logical zero, e.g. VSS from differential memory element 380B. When the memory cell is the selected memory cell, a voltage may be applied to the gates of the access transistors, e.g. WL$_1$, to induce a conductive path through the channels of the access transistors 353B and 354B. On the other hand, when the memory cell is a non-selected memory cell, a voltage too low to maintain a conductive path within the channel of the access transistors 353B and 354B may be applied to the gates of the access transistors, e.g. WL$_2$ through WL$_N$.

The non-selected memory cells may have leakage currents even though the access transistors for the non-selected memory cells are turned off. For instance, when access transistor 354B is off and is coupled to the memory element 380B at a node at V$_{DD}$, the difference between V$_{DD}$ and BL, which is near Vss, may cause some leakage current to flow between memory element 380B and BL. Since BL is floating, however, the leakage current from the memory cells may charge BL to the reverse gate-to-source bias voltage of access transistor 354B. After each access transistor for a non-selected memory cell in memory array 301 is operating near or above their reverse gate-to-source bias regions, the leakage contributions by the non-selected memory cells may be small compared to other sources of noise.

The sense circuit 303 may couple to memory array 301 to sense the voltage difference between BL and BL bar. The sense circuit 303 may comprise a pair of multiplexers, MUX 365 and MUX 366, to couple bit-lines BL and BL bar to BLs and BLs bar respectively. The multiplexers main purpose may be to allow multiple bit-lines to share the same sense amplifier circuitry to reduce overhead area. Pre-discharge circuitry 361 may discharge the bit-lines BLs and BLs bar prior to being coupled to BL and BL bar, in response to a strobe on PRE_SA. Pre-discharge circuitry 361 may discharge BLs and BLs bar in a manner similar to pre-discharge circuitry 360. Further, sense circuit 303 may comprise a sense amplifier (SA) 370 to compare BLs to BLs bar and output selection circuitry, MUX 367, to select the output of SA 370.

Figure 3C:
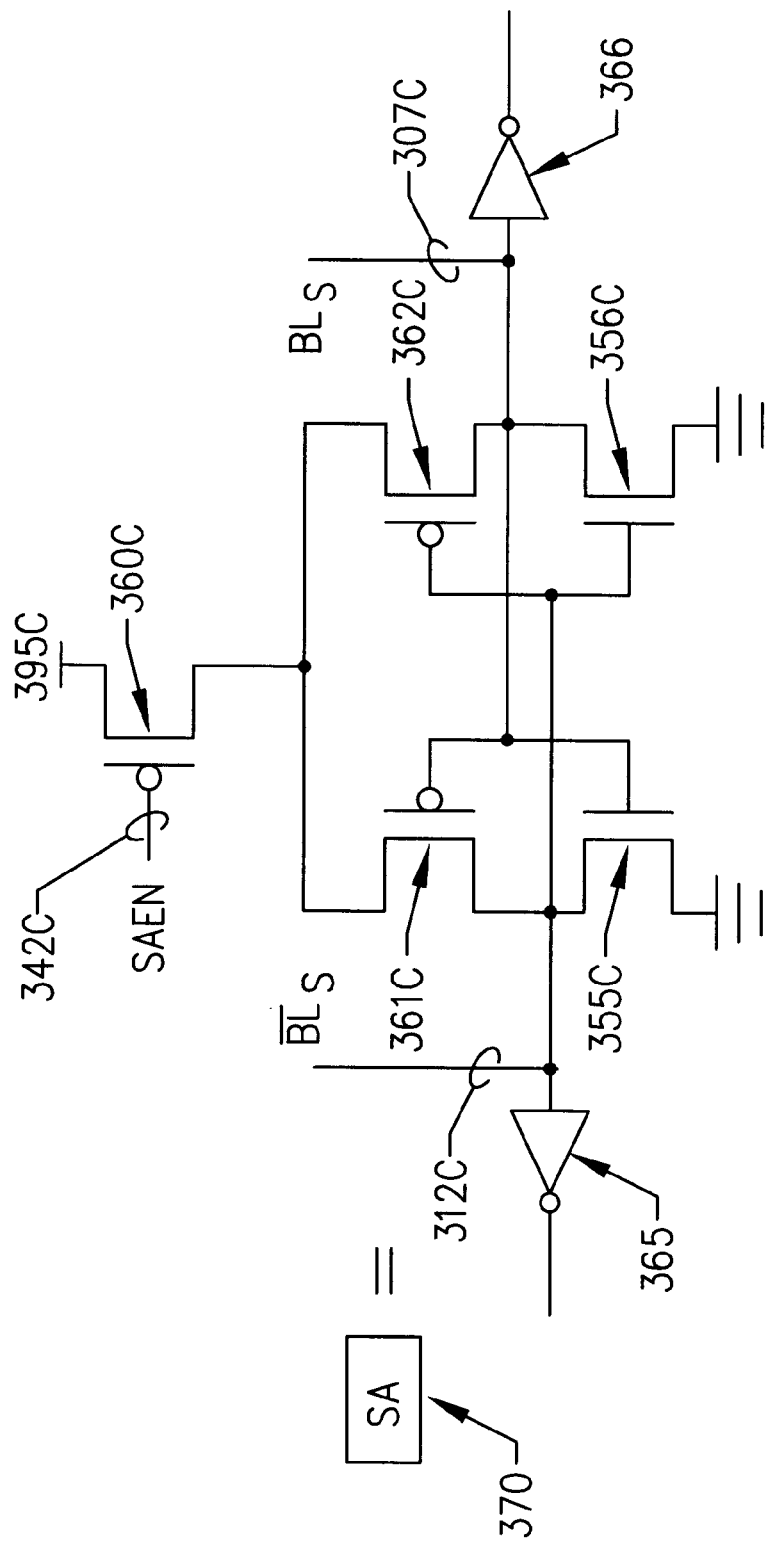

Referring now to FIGS. 3 and 3C, SA 370 may be coupled to BL and BL bar after the bit-line pairs are discharged and the selected memory cell is sourcing charge to BL or BL bar. SA 370 may receive a signal, SAEN via buffer 352, to begin a comparison between the voltages on BLs and BLs bar. When BL, BL bar, BLs, and BLs bar are discharged to a voltage below the reverse gate-to-source bias voltage of the access transistors for the non-selected memory cells, BLs and/or BLs bar may receive leakage current from the non-selected memory cells. After the charge on BLs and/or BLs bar builds up to a sufficient voltage to reverse gate-to-source bias on the access transistors, the rate of charge build up on the bit-lines may be governed by the reverse gate-to-source bias characteristics of the access transistors of the non-selected memory cells. In alternative embodiments, the pre-discharge circuitry 360 and 361 may discharge the bit-lines to a voltage greater than the reverse gate-to-source bias voltage of the access transistors.

A signal may be applied to SAEN to enable the sense amplifier. In response transistor 360C may turn on, coupling the source of transistors 361C and 362C to a power supply node 395C such as V$_{DD}$. Bit-lines BLs and BLs bar may carry the charges from BL and BL bar, respectively, for comparison by SA 370. BLs and BLs bar both may be initialized at ground. SAEN may initially be high so transistor 360C may be off. Transistors 361C and 362C may be on, and transistors 355C and 356C may be off. After a differential voltage is developed between BLs and BLs bar, the SAEN signal may go low, turning on transistor 360C. Therefore, any small differential may flip the amplifier. For instance, when BLs may be higher than BLs bar, transistor 362C may stay on, and transistor 355C may turn on. Further, transistor 361C may turn off, and transistor 356C may stay off. Depending upon the application, one or both of the outputs of SA 370 may be selected by an output circuit, such as MUX 367, to output evaluated data from the selected memory cell at output node 395. The output MUX 367 may connect one of a number of sense amplifiers, such as SA 370, to output 395 to allow a greater number of cells to be electrically sensed at the output node 395.

Figure 4:
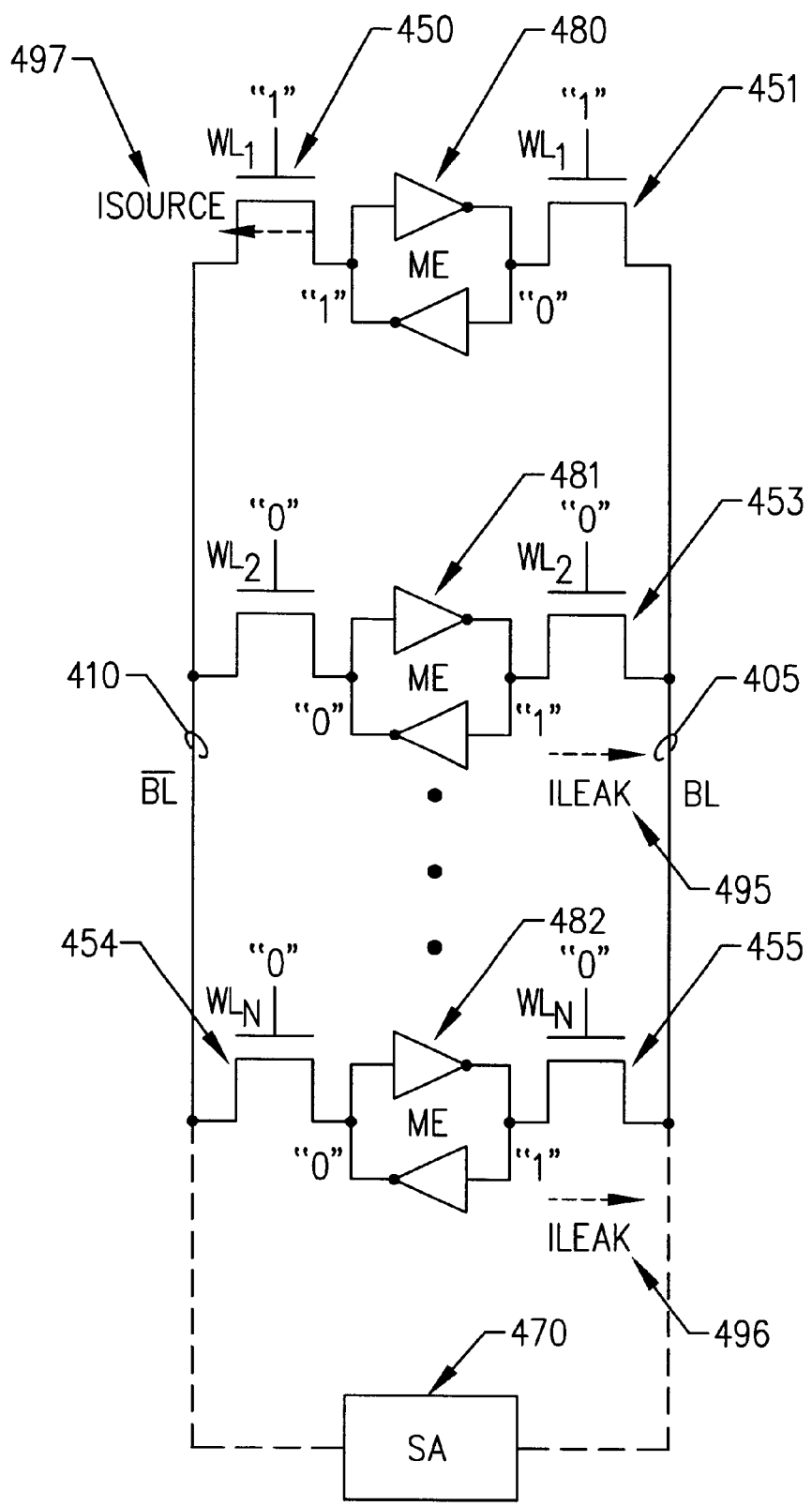
FIG. 4 depicts an example operation of a differential memory array.

Referring now to FIG. 4, there is an example operation of a differential memory array that may be robust to leakage. In the present embodiment, $WL_1$ may have a high voltage, $V_{DD}$, represented by a logical "1", while the word-lines, $WL_2$ through $WL_N$, for the non-selected memory cells, may have a low voltage, Vss, represented by a logical "0". The bit-lines, BL and BL bar, may be discharged to a low voltage and access transistor 450 may source charge from the memory element (ME) 480 of the selected memory cell to BL bar. ME 481 through ME 482, memory elements of non-selected memory cells, may leak current to BL via access transistors 453 and 455. For instance, ME 481 may have a high voltage at the drain of N-type access transistor 453. Charge may pass from ME 481 through N-type transistor 453 to the BL because the BL may be pre-discharged to a low voltage. As a result of the leakage current from one or more of the non-selected memory cells and noise sources, charge may build up on BL and/or BL bar. After the charge generates a potential between the source of access transistor 453 and $WL_2$ greater than the gate voltage of access transistor 453, the access transistor 453 may be operating in reverse gate-to-source bias, significantly reducing the leakage current from ME 481 through 455 to BL. Similarly, access transistor 455 may reverse-bias. At some point while the charge is building up on BL bar from the selected memory cell, SA 470 may determine the contents of ME 480. However, while the charge on BL is building up, the difference in charge between BL and BL bar will increase slowly so SA 470 may take longer to determine the difference. Thus, in some embodiments, BL and BL bar may be pre-discharged to a voltage equal to or greater than the reverse gate-to-source bias voltage of the access transistors of non-selected memory cells.

Figure 5:
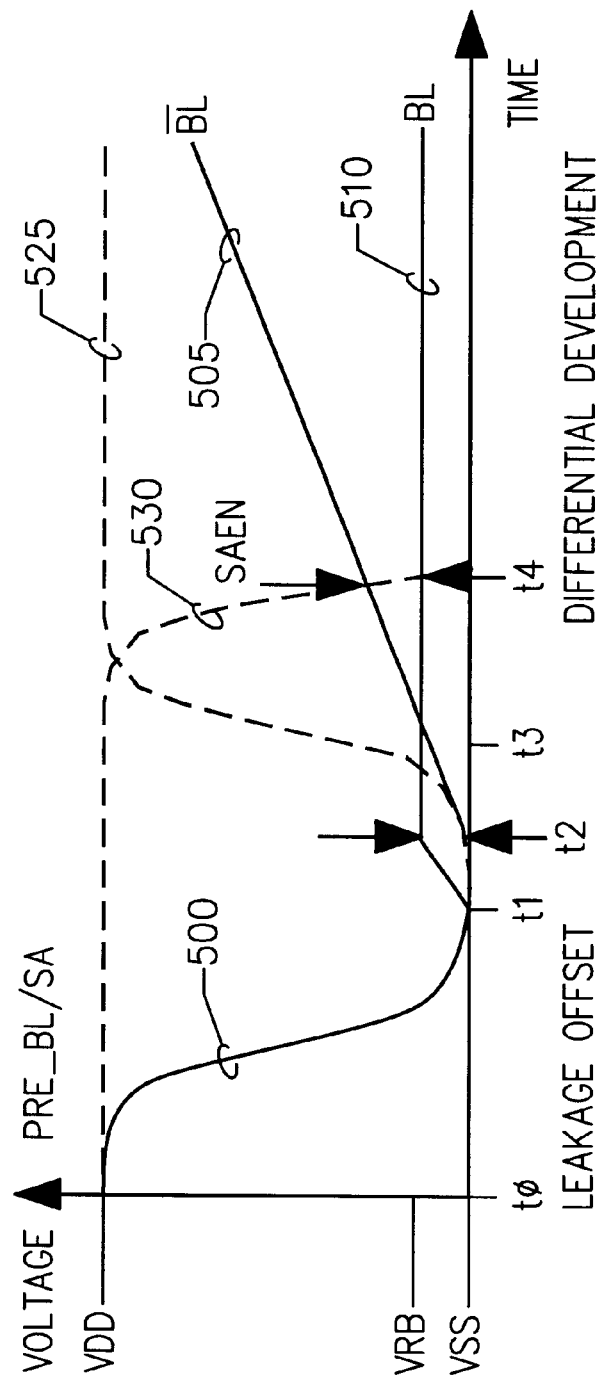
FIG. 5 depicts an example timing diagram for operation of a differential memory array.

Referring now to FIG. 5, there is shown an example time diagram for operation of a differential memory array tolerant to leakage. At $t_0$, the pre-discharge signals for a memory array and a sense circuit, PRE_BL/SA 500, may be high to discharge the bit-lines, BL 510 and BL bar 505. Bit-lines, BL 510 and BL bar 505, may be the bit-lines associated with the memory array and sense circuit. At $t_1$, BL 510 and BL bar 505 may be discharged to Vss and the pre-discharge transistors may be turned off to allow BL 510 and BL bar 505 to float. Further, between $t_1$ and $t_2$, charge leakage from non-selected memory cells may build up a charge on the floating BL 510 and BL bar 505 until the bit-lines reach the reverse gate-to-source bias voltage $V_{RB}$ of the access transistors of the non-selected memory cells. At $t_3$, a selection signal may be applied to the word-line, WL 525, to turn on the access transistors of the selected memory cell. As charge is sourced by the memory element of the selected memory cell to BL bar, the voltage on BL bar continues to rise. At $t_4$, the voltage of the sense enable signal, SAEN 530, may drop to Vss to activate the comparison circuitry of the sense circuit. Some time at or after $t_4$, the sense circuit may determine the difference between BL 510 and BL bar 505 to determine the contents of the selected memory cell. The sense circuit may then condition the result of the comparison to output via an output circuit.

Figure 6:
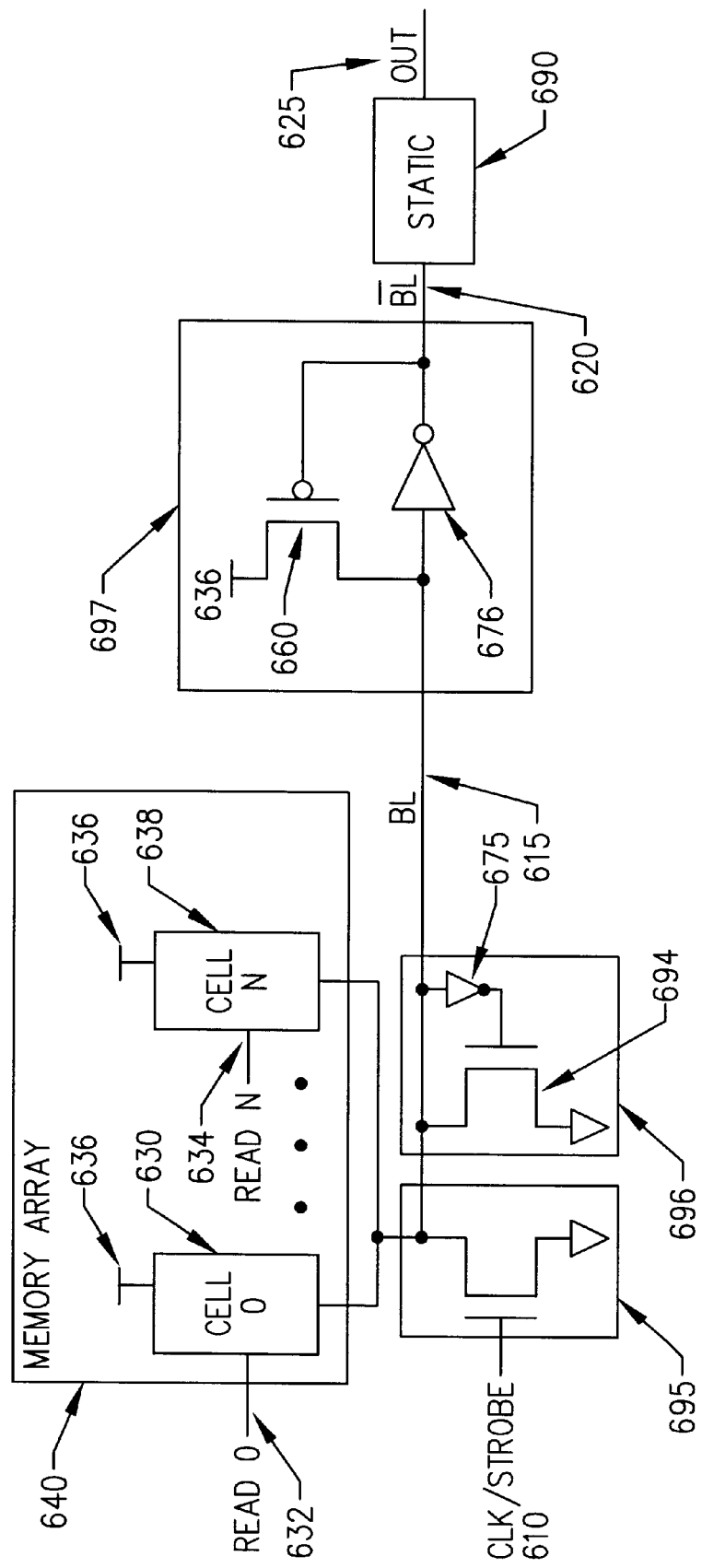
FIG. 6 depicts a single-ended memory array.

Referring now to FIG. 6, there is shown a memory device. The memory device may comprise a bit-line (BL), a pre-discharge circuit 695, a keeper circuit 696, a memory array 640, an inverter output stage 697, and a static output stage 690. The pre-discharge circuit 695 may be designed to discharge BL to a discharge voltage, such as Vss. A clock signal or strobe signal input (clk/strobe) 610 may apply a high circuit voltage, e.g. $V_{DD}$, to the pre-discharge circuit 695. The high voltage may be coupled to a gate of a transistor for the pre-discharge circuit 695 to create a conductive path between BL and Vss via the substrate of the transistor and pull charge from BL to the discharge voltage. In some embodiments, pre-discharge circuit 695 may discharge BL to a voltage higher than Vss but below the high circuit voltage $V_{DD}$. In many of these embodiments, the discharge voltage may be equivalent to or higher than the reverse gate-to-source bias voltage of one or more of the memory cells, $cell_0$ 630 to $cell_N$ 638, of memory array 640. In other embodiments, a low voltage applied to the gate of the transistor may induce a conductive path between BL and the discharge voltage.

After BL is pulled down, the keeper circuit 696 may be capable of pulling leakage charge on BL resulting from leakage or noise from sources such as the memory cells and/or capacitive coupling to other circuitry or wires. The keeper circuit may pull a charge smaller than the charge may build up on BL. In some embodiments, after a high voltage or charge is sourced to BL, the keeper circuit may shut off, no longer sinking leakage charge to the discharge voltage.

The keeper circuit 696 may comprise an inverter 675 having an input coupled to BL, and an N-type transistor 651 having a drain coupled to BL and a source coupled to the discharge voltage. In the present embodiment, the keeper circuit 696 may hold BL at a low charge level while the charge on BL is below a switching threshold voltage of inverter 675. The inverter 675 may invert a low voltage on BL to a high voltage at the gate of an N-type transistor 694. The N-type transistor 694 may enable charge on BL to pass to Vss via the channel of the N-type transistor 694. In some embodiments, when BL is pre-discharged to a voltage higher than the reverse gate-to-source bias voltage of the memory cells, a keeper circuit 696 may be sized to remove noise other than leakage from the memory cells.

Memory array 640 may store data in the form of a charge and be capable of sourcing a charge to BL in response to a selection signal. Each memory cell, $cell_0$ through $cell_N$, may have a selection signal input, Read0 through ReadN. In the present embodiment, a selected memory cell may pass charge from a power supply node 636 having a voltage of approximately $V_{DD}$, in response to a selection signal. Non-selected memory cells may remain off to prevent the non-selected cells from sourcing charge to BL with the exception of a leakage charge, which may be small in this case. In other embodiments, a selected memory cell may source a charge stored within a memory element of the memory cell to BL in response to a selection signal. FIGS. 6A, 6B, and 6C depict example memory cells for a single-ended memory array.

Referring now to FIGS. 6 and 6A, one or more memory cells of $cell_0$ 630 through $cell_N$ 631 may comprise memory cell circuitry 630A. Memory cell circuitry 630A may comprise a storage element 631A, a P-type transistor 635A, and an N-type access transistor 634A. The drain of the P-type transistor 635A may be coupled to power supply node 636A, the gate of the P-type transistor 635A may be coupled to storage element 631A, and the source of the P-type transistor 635A may be coupled to the drain of the N-type access transistor 634A. When the voltage at the output (right most node) of the storage element 631A is low, the P-type transistor 635A may provide a conductive path between the power supply node 636A and the drain of N-type access transistor 634A. Further, when the selection signal Read0 is a high voltage, such as $V_{DD}$, the charge from the power supply node 636A may be passed to BL. On the other hand, when the Read0 632A is a low voltage, transistor 634A is turned off and a leakage charge may flow from access transistor 634A to BL.

Referring now to FIGS. 6, 6A, and 6B, one or more memory cells of cell$_0$ 630 through cell$_N$ 631 may comprise memory cell circuitry 630B. The memory cell circuitry 630B may operate in a manner similar to memory cell 630A, but the drain of the access transistor 634B may couple directly to the memory element 631B to source charge from the memory element rather than sourcing charge from a power supply node, such as power supply node 636A, in response to a selection signal. Further, after transistor 634B is turned off, the memory element 631B rather than a power supply node may source leakage charge.

Referring now to FIGS. 6, 6A, and 6C, one or more memory cells of cell$_0$ 630 through cell$_N$ 631 may comprise memory cell circuitry 630C. The memory cell circuitry 630C may also operate in a manner similar to memory cell 630A, but an N-type transistor having a gate coupled to memory element 631C, may provide a conductive path between power supply node 636C and access transistor 634C, depending upon the contents of the memory element 631C.

A voltage, resulting from leakage current from access transistors 634A, 634B, and/or 634C, noise, and/or the discharge voltage, on BL near, equal to or greater than a reverse gate-to-source bias for access transistors 634A, 634B, and/or 634C, may limit leakage current significantly relative to other noise sources coupled to BL. In addition, the amount of charge on BL that reverse-biases the access transistors may not be proportional to the number of memory cells coupled to BL. This reverse gate-to-source bias voltage on BL may vary depending on the number of read transistors coupled to the bit-line. As more read transistors are coupled to the bit-line, more reverse gate-to-source bias voltage may be applied to reduce the same leakage current as a BL having less read transistors coupled to it.

Referring again to FIG. 6, the inverter output stage 697 may convert the voltage on BL to a low voltage when the voltage is greater than a threshold voltage and to a high voltage when the voltage is less than a threshold voltage. The inverter output stage 697 may comprise a P-type transistor 660, an inverter 676, and an output BL bar. The inverter 676 may invert the charge on BL when the voltage crosses a switching threshold voltage between $V_{DD}$ and Vss. In some embodiments, inverter 676 may comprise hysteresis circuitry to stabilize the output, BL bar. For instance, when the voltage on BL is below a switching threshold voltage, such as $(V_{DD}-Vss)/2$, the inverter may output a high voltage at the gate of P-type transistor 660. Until the voltage on BL rises to a voltage above $(V_{DD}-Vss)/2$, the inverter may maintain a high voltage at the gate of the P-type transistor 660 and the P-type transistor may remain off. On the other hand, when BL rises to a voltage above $(V_{DD}-Vss)/2$, the inverter may output a low voltage, e.g. Vss, to the gate of P-type transistor 660, and the P-type transistor may allow charge to pass from power supply node 642 to BL, pulling the voltage of BL up to maintain BL at a high voltage and BL bar at a low voltage. In other embodiments, the inverter output stage 697 may use an N-type transistor. PMOS 660 may ensure a full-rail transition on BL to a high voltage.

The static output stage 690 may convert the voltage from the inverter output stage 697, BL bar, to a compatible logic state output at output node 625. In other embodiments, the static output stage 690 may directly convert the voltage of BL to a compatible logic state output without an inverter output stage 697. In one embodiment, the static output stage 690 may condition BL bar to be an output signal compatible with other circuitry. In another embodiment, multiple bit-lines from multiple memory cell groups may be coupled to a single static stage 690 and conditioned for an output signal to output node 625. In some of these embodiments, the multiple bit-lines may be coupled to the static output stage 690 via a multiplexer or standard static CMOS logic.

Figure 7:
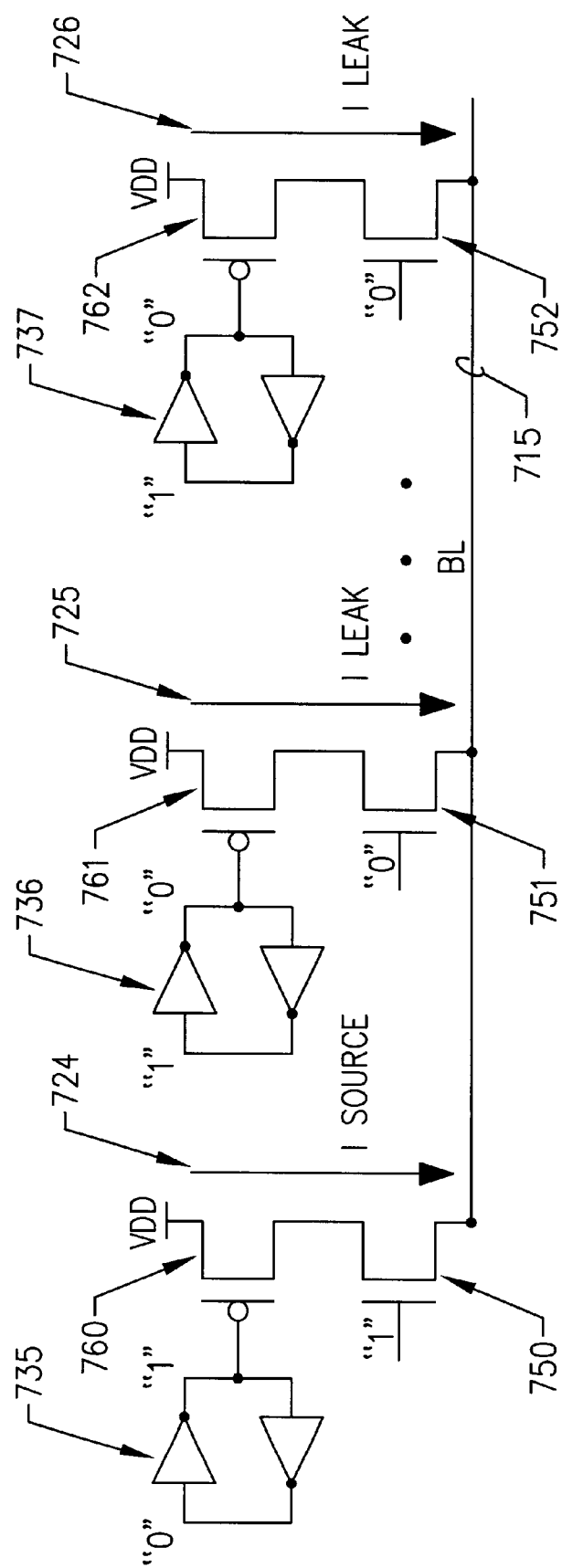
FIG. 7 depicts an example operation of a single-ended memory array.

Referring now to FIG. 7, there is shown an example operation of a single-ended memory array that may be leakage tolerant. The single-ended memory array may comprise memory cells having memory elements 735 through 737 coupled to transistors 760 through 762, respectively, and access transistors 750 through 752 to transistors 760 through 762 to BL, respectively. Pre-discharge circuitry may receive a pre-discharge signal and discharge BL to Vss or a voltage greater than the reverse gate-to-source bias voltage but less than $V_{DD}$. The reverse gate-to-source bias voltage of the memory cells may be less than the voltage to which BL is discharged. The access transistors 750 through 752 may be reverse biased because the BL voltage is greater than the reverse gate-to-source bias voltage of the access transistors 751 through 752. When BL is discharged to a voltage above Vss there may be a noise margin above the BL predischarge voltage "0".

In the present embodiment, the selected memory element 735 comprises a logical "1" at the output coupled to the gate of transistor 760. The logical "1" in this embodiment may be represented by a high voltage such as $V_{DD}$. The high voltage turns off transistor 760 to prevent charge from passing through the channel of transistor 760 to access transistor 750. As a result of being selected, access transistor 750 may have a high voltage applied to the gate, represented by a logical "1", to turn on access transistor 750. However, little or no source current 724 may be sourced through access transistor 750 to BL since transistor 760 is turned off.

The access transistors 751 through 752 of the non-selected memory cells may also have leakage currents. In the present embodiment, the non-selected memory cells comprise a low voltage coupled to transistors 761 through 762 so leakage 725 through 726 may be based on the application of $V_{DD}$ at the drains and Vss at the sources of access transistors 751 through 752. As the charge build up on BL increases the voltage on BL to the reverse gate-to-source bias voltage of access transistors 751 through 752, the leakage currents 725 through 726 may reduce in accordance with the reverse-bias characteristics of the access transistors.

Figure 8:
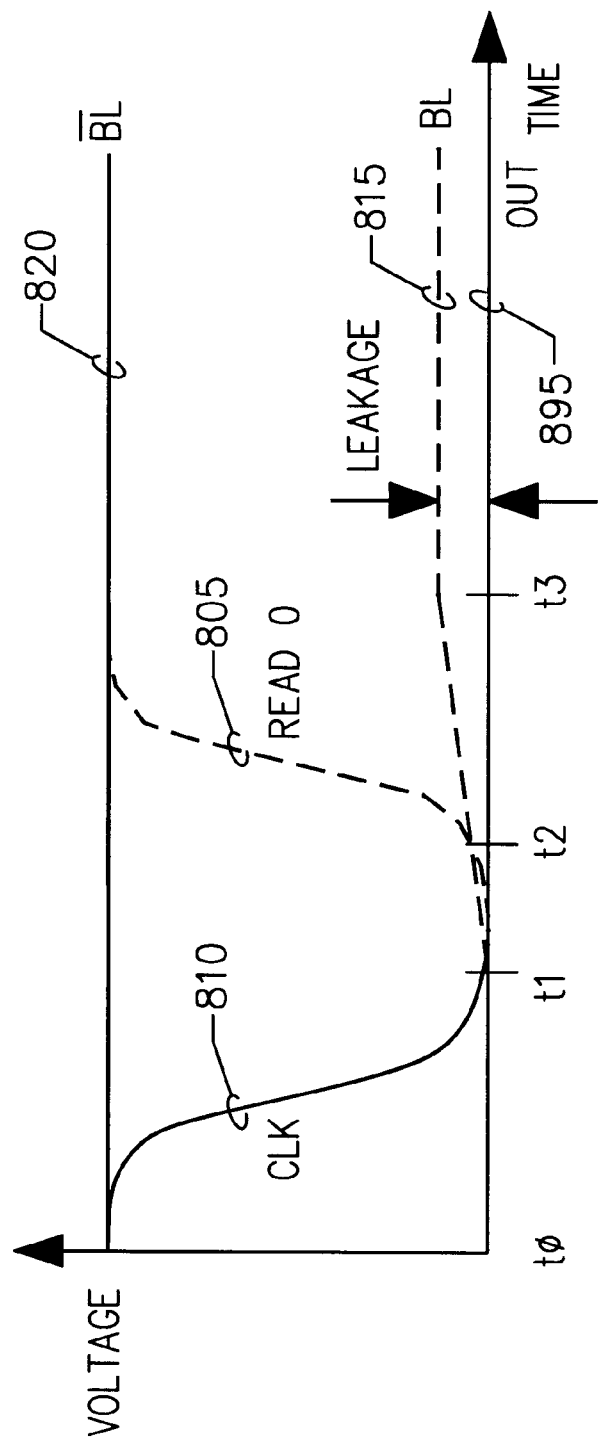
FIG. 8 depicts an example timing diagram for operation of a single-ended memory array.

Referring now to FIG. 8, there is shown depicts an example time diagram for operation of a differential memory array to attenuate charge leakage of memory cells. At $t_0$, CLK, the pre-discharge signal for a memory array may be high to discharge the bit-line, BL, railing BL bar at $V_{DD}$ at substantially the same time. At $t_1$, BL may be discharged to Vss and the pre-discharge transistors may be turned off to allow BL to float. Further, between $t_1$ and $t_2$, leakage current may build up a charge on the floating BL until BL reaches the reverse gate-to-source bias voltage, $V_{RB}$, of the access transistors of the non-selected memory cells at $t_3$. At $t_2$, a selection signal, Read0, may be applied to the word-line of the selected memory cell to turn on the access transistor of the selected memory cell. When charge is sourced by the memory element of the selected memory cell to BL, the voltage on BL may continue to rise but, in the present embodiment, the selected memory cell may contain a low logic state and not source charge to BL. Further, the output, OUT, may be the inverse of BL bar.

In an alternative situation, when the selected memory cell is sourcing charge to BL, the sense circuit may determine that BL is greater than or equal a switching threshold voltage and BL bar may be reduced from $V_{DD}$ to Vss. In further embodiments, OUT may equivalent to BL bar rather than the inverse of BL bar.

Figure 9:
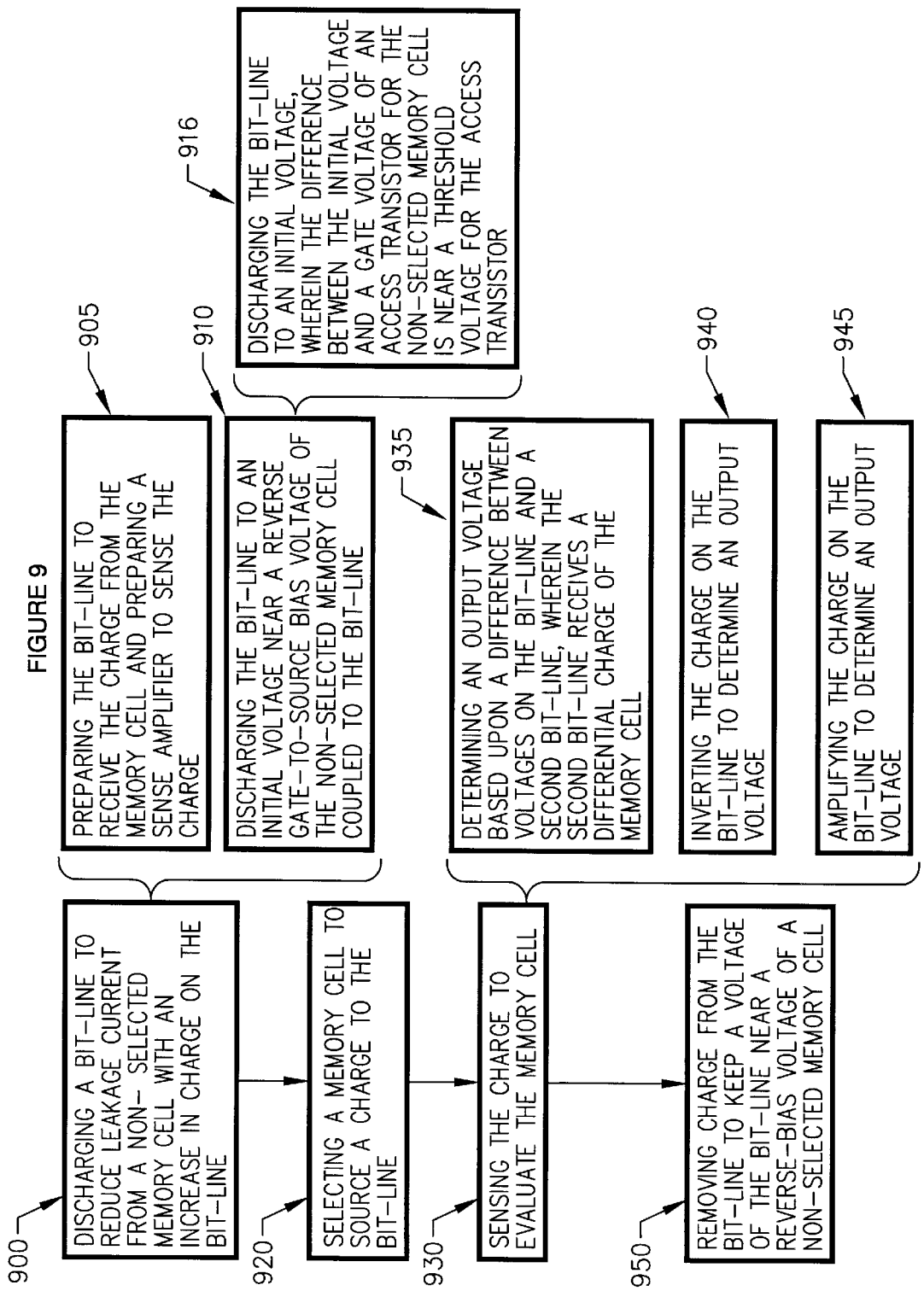
FIG. 9 depicts a flow chart of an embodiment for leakage tolerant memory.

Referring now to FIG. 9, there is a flow chart of an embodiment for leakage tolerant memory. The embodiment may comprise discharging a bit-line to reduce the leakage from a non-selected memory cell with an increase in charge on the bit-line 900, selecting a memory cell to source a charge to the bit-line 920, sensing the charge to evaluate the memory cell 930, and removing charge from the bit-line to keep a voltage of the bit-line near a reverse-bias voltage of a non-selected memory cell 950. Discharging a bit-line to reduce leakage from a non-selected memory cell with an increase in charge on the bit-line 900 may discharge a bit-line to source charge to the bit-line with a first memory cell and to reduce leakage currents of a second memory cell in response to a charge on the bit-line near a reverse gate-to-source bias voltage of a second memory cell, enabling a device such as a memory cache to perform in a more leakage tolerant manner. Discharging a bit-line to reduce leakage from a non-selected memory cell with an increase in charge on the bit-line 900 may comprise preparing the bit-line to receive the charge from the memory cell and preparing a sense amplifier to sense the charge 905 and discharging the bit-line to an initial voltage near a reverse gate-to-source-bias voltage of the non-selected memory cell coupled to the bit-line 910.

Preparing the bit-line to receive the charge from the memory cell and preparing a sense amplifier to sense the charge 905 may comprise substantially equalizing the charge on a differential pair of bit-lines associated with the memory array and a differential pair of bit-lines associated with the sensing circuitry to remove some of the effects of noise on the sense circuitry. In many embodiments, preparing the bit-line to receive the charge from the memory cell and preparing a sense amplifier to sense the charge 905 may comprise discharging both bit-line associated with a sensing circuit and a bit-line associated with the memory array to allow low voltage switching, wherein the low voltage switching may be used to select the memory array comprising the selected memory cell. In such embodiments, the sensing circuitry may be used to sense the contents of memory cells in more than one memory array.

Discharging the bit-line to an initial voltage near a reverse gate-to-source-bias voltage of the non-selected memory cell coupled to the bit-line 910 may discharge to a voltage above a reverse gate-to-source-bias voltage of a non-selected memory cell to allow a non-selected memory cell to remain reverse-biased or be moved further into its reverse-bias operating region when sourcing charge to the bit-line from the selected memory cell. In some embodiments, discharging the bit-line to an initial voltage near a reverse gate-to-source-bias voltage of the non-selected memory cell coupled to the bit-line 910 may comprise pulling down the charge on the bit-line to a charge at or below a reverse bias voltage associated with the non-selected memory cell. Further, discharging the bit-line to an initial voltage near a reverse gate-to-source bias voltage of the non-selected memory cell coupled to the bit-line 910 may comprise discharging the bit-line to an initial voltage, wherein the difference between the initial voltage and a gate voltage of an access transistor for the non-selected memory cell is near a threshold voltage for the access transistor 915. Discharging the bit-line to an initial voltage, wherein the difference between the initial voltage and a gate voltage of an access transistor for the non-selected memory cell is near a threshold voltage for the access transistor 915 may discharge a bit-line to a voltage near a reverse-bias voltage for an access transistor.

Selecting a memory cell to source a charge to the bit-line 920 may apply a voltage to the selected memory cell. In many embodiments, selecting a memory cell to source a charge to the bit-line 920 may comprise decoding a row and column for a memory cell from an address. In many embodiments, a bank address may also be decoded. In some embodiments, selecting a memory cell to source a charge to the bit-line 920 may further comprise selecting and enabling a sense circuit associated with the memory array comprising the selected memory cell.

Sensing the charge to evaluate the memory cell 930 may compare a voltage or charge on a bit-line to a fixed voltage or a differential voltage to determine the contents of the selected memory cell. Sensing the charge to evaluate the memory cell 930 may comprise determining an output voltage based upon a difference between charges on the bit-line and a second bit-line, wherein the second bit-line receives to a differential charge of the memory cell 935, inverting the charge on the bit-line to determine an output voltage 940, and amplifying the charge on the bit-line to determine an output voltage 945.

Determining an output voltage based upon a difference between charges on the bit-line and a second bit-line, wherein the second bit-line receives a differential charge of the memory cell 935 may compare the voltage of the bit-line and the second bit-line to determine whether the bit-line is a higher voltage than the second bit-line or a lower voltage than the second bit-line. In several of these embodiments, comparing the voltage of the bit-line and the second bit-line may comprise applying the voltage on the bit-line to the gate or base of a three terminal device, as well as applying the voltage on the second bit-line to the gate or base of a second three terminal device. The results of such a comparison may be output by pulling up or pulling down an output node with a power supply node.

Inverting the charge on the bit-line to determine an output voltage 940 may, for example, invert the charge of a single-ended memory such as a single-ended cache. In one embodiment, inverting the charge on the bit-line to determine an output voltage 940 may output a voltage based upon the voltage on the bit-line or the inverse of the voltage on the bit-line. In several of these embodiments, the inverse of the bit-line is determined by outputting a determination of the voltage on the second bit-line.

Amplifying the charge on the bit-line to determine an output voltage 945 may increase a voltage determined to be high to $V_{DD}$ or another voltage of a high voltage logic state and/or decreasing a voltage determined to be low to Vss or another voltage of a low voltage logic state. In some embodiments, amplifying the charge on the bit-line to determine an output voltage 945 may comprise gaining the signal with a three terminal device and/or an operational amplifier.

Removing charge from the bit-line to keep a voltage of the bit-line near a reverse-bias voltage of a non-selected memory cell 950 may comprise incorporating a keeper circuit or another charge bleeding device to remove charge from the bit-line. In many of these embodiments, the keeper circuitry or other charge bleeding device remains on even after a high voltage charge is sourced to the bit-line via a selected memory cell. In other embodiments, the keeper or bleeder turns off after a high voltage charge is sourced to the bit-line via a selected memory cell. Further embodiments incorporate a keeper circuit that may be designed to remove some of the leakage current from non-selected cells, although several embodiments are designed to remove leakage resulting from other noise on the bit-line.

Referring now to FIG. 10, a machine-readable medium embodiment is shown. A machine-readable medium includes any mechanism that provides (i.e. stores and/or transmits) information in a form readable by a machine (e.g., a computer), that when executed by the machine, can perform the functions described herein. For example, a machine-readable medium may include read-only memory (ROM); random access memory (RAM); magnetic disk storage media; optical storage media; flash memory devices; electrical, optical, acoustical, or other form of propagated signals (e.g. carrier waves, infrared signals, digital signals, etc.); etc. . . . Several embodiments can comprise more than one machine-readable medium depending on the design of the machine.

The machine-readable medium 1000 may comprise instructions to reduce leakage of memory cells. The machine-readable medium 1000 may comprise instructions for discharging a bit-line to attenuate charge leakage from a non-selected memory cell with an increase in charge on the bit-line 1010, selecting a memory cell to source a charge to the bit-line 1020, and sensing the charge to evaluate the memory cell 1030. Discharging a bit-line to reduce leakage from a non-selected memory cell with an increase in charge on the bit-line 1010 may discharge a bit-line to facilitate reverse gate-to-source biasing a non-selected memory cell when charge is leaked or sourced to the bit-line. Discharging a bit-line to attenuate charge leakage from a non-selected memory cell with an increase in charge on the bit-line 1010 may comprise instructions for discharging a bit-line by momentarily coupling the bit-line to a low voltage such as Vss and then decoupling the bit-line from the low voltage. In many embodiments, coupling the bit-line to ground momentarily may comprise applying a pulse of a clock or strobe to the gate of a transistor or other three-terminal device to couple the bit-line to the low voltage through the substrate of the device. Further, several embodiments that comprise instructions for discharging the bit-line to an initial voltage near a reverse-bias voltage of the non-selected memory cell coupled to the bit-line may discharge to a voltage above a reverse-bias voltage of a non-selected memory cell to allow a non-selected memory cell to remain reverse-biased or be moved further into its reverse-bias operating region when sourcing charge to the bit-line from the selected memory cell.

Selecting a memory cell to source a charge to the bit-line 1020 may comprise instructions for determining a memory block, array, and sense circuit to select and applying a voltage to the memory cell in a substantially pre-determined order to evaluate the selected memory cell. In many embodiments, selecting a memory cell to source a charge to the bit-line 1020 may comprise instructions for selecting and enabling a sense circuit associated with the memory array comprising the selected memory cell.

Sensing the charge to evaluate the memory cell 1030 may comprise instructions for determining an output voltage based upon a difference between charges on the bit-line and a second bit-line, wherein the second bit-line receives to a differential charge of the memory cell, inverting the charge on the bit-line to determine an output voltage, and amplifying the charge on the bit-line to determine an output voltage.

What is claimed is:

1. An apparatus, comprising:
 a memory array comprising a memory cell coupled to a bit-line to source a charge to the bit-line;
 a pre-discharge circuit coupled to said memory array to discharge the bit-line to reduce leakage current from a second memory cell with an increase in charge on the bit-line;
 a sense circuit coupled to said memory array to output a voltage based upon the charge on the bit-line; and
 a keeper circuit to remove charge from the bit-line.

2. An apparatus, comprising:
 a memory array comprising a memory cell coupled to a bit-line to source a charge to the bit-line;
 a pre-discharge circuit coupled to said memory array to discharge the bit-line to reduce leakage current from a second memory cell with an increase in charge on the bit-line; and
 a sense circuit coupled to said memory array to output a voltage based upon the charge on the bit-line;
 wherein said pre-discharge circuit comprises circuitry to discharge the bit-line to a voltage near a reverse gate-to-source bias voltage of an access transistor for the second memory cell.

3. An apparatus, comprising:
 a memory array comprising a memory cell coupled to a bit-line to source a charge to the bit-line;
 a pre-discharge circuit coupled to said memory array to discharge the bit-line to reduce leakage current from a second memory cell with an increase in charge on the bit-line; and
 a sense circuit coupled to memory array to output a voltage based upon the charge on the bit-line;
 wherein said pre-discharge circuit comprises circuitry to discharge said sense circuit.

4. An apparatus, comprising:
 a memory array comprising a memory cell coupled to a bit-line to source a charge to the bit-line;
 a pre-discharge circuit coupled to said memory array to discharge the bit-line to reduce leakage current from a second memory cell with an increase in charge on the bit-line; and
 a sense circuit coupled to said memory array to output a voltage based upon the charge on the bit-line;
 wherein said sense circuit comprises circuitry to invert a charge on the bit-line.

5. An apparatus, comprising:
 a memory array comprising a memory cell coupled to a bit-line to source a charge to the bit-line;
 a pre-discharge circuit coupled to said memory array to discharge the bit-line to reduce leakage current from a second memory cell with an increase in charge on the bit-line; and
 a sense circuit coupled to said memory array to output a voltage based upon the charge on the bit-line;
 wherein said sense circuit comprises static stage circuitry to output the voltage based upon the charge on the bit-line.

6. An apparatus, comprising:
a memory array comprising a memory cell coupled to a bit-line to source a charge to the bit-line;
a pre-discharge circuit coupled to said memory array to discharge the bit-line to reduce leakage current from a second memory cell with an increase in charge on the bit-line; and
a sense circuit coupled to said memory array to output a voltage based upon the charge on the bit-line;
wherein said sense circuit comprises circuitry to output the voltage based upon a comparison of the bit-line charge to a charge on a second bit-line.

7. A method, comprising:
discharging a bit-line to reduce leakage current from a non-selected memory cell with an increase in charge on the bit-line;
selecting a memory cell to source a charge to the bit-line;
sensing the charge to evaluate the memory cell; and
removing charge from the bit-line to keep a voltage of the bit-line near a reverse-bias voltage of a non-selected memory cell.

8. A method, comprising:
discharging a bit-line to reduce leakage current from a non-selected memory cell with an increase in charge on the bit-line;
selecting a memory cell to source a charge to the bit-line; and
sensing the charge to evaluate the memory cell;
wherein said discharging the bit-line comprises discharging the bit-line to an initial voltage near a reverse gate-to-source bias voltage of the non-selected memory cell coupled to the bit-line.

9. The method of claim 8, wherein a difference between the initial voltage and a gate voltage of an access transistor for the non-selected memory cell is near a threshold voltage for the access transistor.

10. A method, comprising:
discharging a bit-line to reduce leakage current from a non-selected memory cell with an increase in charge on the bit-line;
selecting a memory cell to source a charge to the bit-line; and
sensing the charge to evaluate the memory cell;
wherein said sensing the charge comprises
determining an output voltage based upon a difference between voltages on the bit-line and a second bit-line, wherein the second bit-line receives a differential charge of the memory cell.

11. A method, comprising:
discharging a bit-line to reduce leakage current from a non-selected memory cell with an increase in charge on the bit-line;
selecting a memory cell to source a charge to the bit-line; and
sensing the charge to evaluate the memory cell;
wherein said sensing the charge comprises inverting the charge on the bit-line to determine an output voltage.

12. A system, comprising:
a memory device, comprising
a memory array comprising a memory cell coupled to a bit-line to source a charge to the bit-line;
a pre-discharge circuit coupled to said memory array to discharge the bit-line to reduce leakage current from a second memory cell with an increase in charge on the bit-line;
a sense circuit coupled to said memory array to output a voltage based upon the charge on the bit-line; and
a memory controller coupled to said memory device to retrieve data from said memory device;
wherein said memory device comprises circuitry to discharge the bit-line to a voltage near a reverse gate-to-source bias voltage of an access transistor for the second memory cell.

13. An apparatus, comprising:
a first access transistor having a source and a gate;
a first memory element coupled with the gate;
a bit-line coupled with the source;
a second memory element coupled with said bit-line;
a pre-discharge circuit coupled with said bit-line; and
a sense circuit coupled wit said bit-line;
wherein said sense circuit is coupled with said bit-line via a multiplexer.

14. An apparatus, comprising:
a first access transistor having a source and a gate;
a first memory element coupled with the gate;
a bit-line coupled with the source;
a second memory element coupled with said bit-line;
a pre-discharge circuit coupled with said bit-line; and
a sense circuit coupled with said bit-line;
wherein the first memory element comprises a buffer.

15. An apparatus, comprising:
an access transistor having a source and a gate;
a first memory element coupled with the gate;
a bit-line coupled with the source;
a second memory element coupled with said bit-line;
a pre-discharge circuit coupled with said bit-line; and
a sense circuit coupled with said bit-line;
wherein the first memory element comprises
a memory element transistor coupled with said access transistor; and
a buffer coupled with the memory element transistor.

16. The apparatus of claim 15, wherein the memory element transistor comprises a p-channel field effect transistor.

17. An apparatus, comprising:
a first access transistor having a source and a gate;
a first memory element coupled with the gate;
a bit-line coupled with the source;
a second memory element coupled with said bit-line;
a pre-discharge circuit coupled with said bit-line; and
a sense circuit comprising an inverter coupled with said bit-line.

* * * * *